United States Patent
Diab et al.

(10) Patent No.: US 8,370,701 B2
(45) Date of Patent: Feb. 5, 2013

(54) SYSTEM AND METHOD FOR ACHIEVING GREATER THAN 10 GBIT/S TRANSMISSION RATES FOR TWISTED PAIR PHYSICAL LAYER DEVICES

(75) Inventors: Wael William Diab, San Francisco, CA (US); Scott Powell, Alisa Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 656 days.

(21) Appl. No.: 12/578,277

(22) Filed: Oct. 13, 2009

(65) Prior Publication Data

US 2011/0022923 A1 Jan. 27, 2011

Related U.S. Application Data

(60) Provisional application No. 61/227,432, filed on Jul. 21, 2009.

(51) Int. Cl.
*G06F 11/00* (2006.01)
(52) U.S. Cl. ...................................................... 714/753
(58) Field of Classification Search ................... 714/753
See application file for complete search history.

(56) References Cited

U.S. PATENT DOCUMENTS

| | | | |
|---|---|---|---|
| 7,869,468 B1* | 1/2011 | Giannakopoulos et al. | 370/535 |
| 2009/0077395 A1* | 3/2009 | Tsai | 713/310 |
| 2010/0229067 A1* | 9/2010 | Ganga et al. | 714/752 |
| 2010/0296559 A1* | 11/2010 | Barbieri et al. | 375/222 |

* cited by examiner

*Primary Examiner* — Bryce Bonzo
(74) *Attorney, Agent, or Firm* — Duane S. Kobayashi

(57) ABSTRACT

A system and method for achieving greater than 10 Gbit/s transmission rates for twisted pair physical layer devices. An architecture is provided that enables transmission at the next standardized transmission rate over structured cabling.

15 Claims, 4 Drawing Sheets

US 8,370,701 B2

SYSTEM AND METHOD FOR ACHIEVING GREATER THAN 10 GBIT/S TRANSMISSION RATES FOR TWISTED PAIR PHYSICAL LAYER DEVICES

This application claims priority to provisional application No. 61/227,432, filed Jul. 21, 2009, which is incorporated herein by reference in its entirety.

BACKGROUND

1. Field of the Invention

The present invention relates generally to Ethernet systems and, more particularly, to a system and method for achieving greater than 10 Gbit/s transmission rates for twisted pair physical layer devices.

2. Introduction

Ethernet devices continue to evolve in capability as the incremental increases in the standardized transmission rates have progressed by orders of magnitude. In a relatively short period of time, transmission rates for standardized twisted pair Ethernet devices have progressed from 10 Mbit/s to 100 Mbit/s, from 100 Mbit/s to 1 Gbit/s, and more recently, 1 Gbit/s to 10 Gbit/s. Efforts are ongoing to identify the next highest transmission rate. What is needed therefore is a next standard of Ethernet performance for twisted pair devices that operates at a transmission rate significantly higher than 10 Gbit/s.

SUMMARY

A system and method for achieving greater than 10 Gbit/s transmission rates for twisted pair physical layer devices, substantially as shown in and/or described in connection with at least one of the figures, as set forth more completely in the claims.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1:
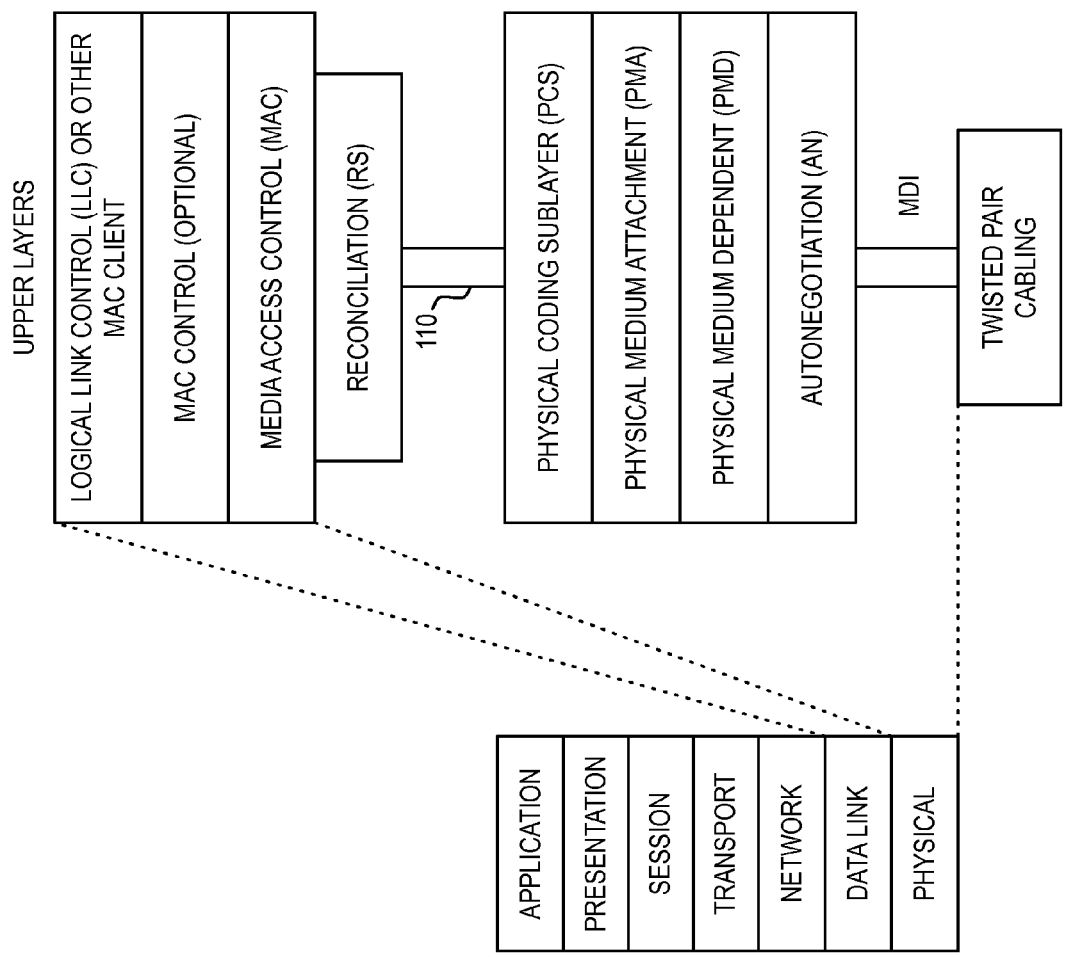
FIG. 1 illustrates an OSI layering diagram.

Various embodiments of the invention are discussed in detail below. While specific implementations are discussed, it should be understood that this is done for illustration purposes only. A person skilled in the relevant art will recognize that other components and configurations may be used without parting from the spirit and scope of the invention.

Ethernet has become an increasingly pervasive technology that has been applied in various contexts, including twisted pair, backplane, and optical applications. In the twisted-pair context, the current state of the art physical layer device (PHY) technology is the GBASE-T standard, which provides a specification for a link transmission rate at 10 Gbit/s. As is expected, transmission rates greater than 10 Gbit/s are needed in a cost-effective solution. In that regard, greater than 10 Gbit/s optical links and serial copper links are not believed to be cost-effective over the long term.

In accordance with the present invention, a cost-effective solution is provided that enables 40 or 100 Gbit/s transmission (or intermediate transmission rates beyond 10 Gbit/s) over structured cabling. To illustrate the features of the present invention, reference is first made to FIG. 1, which illustrates the ISO Open System Interconnection (OSI) reference model and its mapping to the IEEE 802.3 layering.

As illustrated, the PHY includes a physical coding sublayer (PCS), a physical medium attachment (PMA), physical media dependent (PMD), and auto-negotiation (AN). The PHY interfaces with twisted pair cabling over a medium dependent interface (MDI).

In general, AN provides a linked device with the capability to detect the abilities (modes of operation) supported by the device at the other end of the link, determine common abilities, and configure for joint operation. Typically, the AN process identifies the best possible mode of operation (or highest common denominator) that is shared by the two PHY devices. Here, a particular priority between different modes of operation can be defined, for example, where a higher speed is preferred over a lower speed, and full duplex is preferred over half duplex at the same speed. Autonegotiation can also be applied asymmetrically to a link.

In one embodiment, the AN of a 40 Gbit/s PHY is designed to select from a 40 Gbit/s operating mode over structured cabling as well as standard operating modes at 10 Mbit/s, 100 Mbit/s, 1 Gbit/s, and 10 Gbit/s over structured cabling. In that regard, the 40 Gbit/s PHY can be designed to provide legacy support for one or more of the standard operating rates. For example, a triple-speed 40 Gbit/s PHY can be designed to support 40 Gbit/s, 10 Gbit/s, and 1 Gbit/s transmission rates over structured cabling.

In another embodiment, the AN of the 40 Gbit/s PHY can be designed to select from a plural set of operating modes that include non-standard operating modes (e.g., 2.5 Gbit/s, 5 Gbit/s, etc. transmission over structured cabling) in addition to the standard operating modes noted above. In that regard, the 40 Gbit/s PHY can be designed to provide legacy support for one or more non-standard rates and/or standard operating rates. For example, a 40 Gbit/s PHY can be designed to support 40 Gbit/s, 10 Gbit/s, and 5 Gbit/s transmission rates over structured cabling.

As has been described, the AN process of the 40 Gbit/s PHY can be used to select from a mix of standard and non-standard operating modes. In one embodiment, the AN process of the 40 Gbit/s PHY can be used to autonegotiate to a variable rate. Here, each 40 Gbit/s PHY can test the channel and exchange information regarding the channel (e.g., type of cable, length of cable, etc.), which information can be used by the 40 Gbit/s PHY to select a particular operating mode. In various examples, the AN process can select a 40 Gbit/s transmission rate if Category 7A cabling is detected, select a 10 Gbit/s transmission rate if Category 6A cabling is detected, select a 40 Gbit/s transmission rate if 15 meters of Category 6A cabling is detected, etc. In general, the AN process can be designed to select an operating mode based not only on the capabilities of the PHYs themselves, but also the capabilities of the particular channel between them. In various embodiments, the enhanced AN process can be based on unformatted next page messages, physical signaling that supplements or even replaces conventional AN signaling, Layer 2 messaging, or any combination thereof.

The large number of variations in operating modes is due to the large variations in cabling that can be present between the 40 Gbit/s PHYs. Indeed, it is a feature of the present invention that the 40 Gbit/s PHY can be designed to condition the selected operating mode based on the type and length of cabling detected, or more generally the characteristics of the communication channel.

As Ethernet PHY technology has advanced, so also has the cabling technology. Various types of Ethernet-compatible cabling exist. For example, performance characteristics represented by Category 3 unshielded twisted pair cabling enable 10BASE-T transmission but not 100BASE-TX transmission, which requires performance characteristics exhibited by Category 5 or 5e cabling. Category 6 cabling was then defined as the cable standard for supporting 1000BASE-T operation. Since that time, cabling advancements have led to advanced Category 6A, 7, 7A, which can support frequencies up to 1 Ghz, and enhanced 7A or newer cabling, which can support frequencies up to 2 Ghz and beyond. It is believed that Category 7, 7A and enhanced 7A cabling can support 40 Gbit/s transmission at distances up to 100 meters.

The variations in Ethernet cabling are dependent upon variations in the outer shielding as well as twisted pair shielding. One convention uses the variables U:unshielded, S:shielded, or F:foil in the nomenclature "O"/"P" TP, where "O" is the type of outer shielding and "P" is the type of pair shielding. Thus, Category 5e cabling can be U/UTP cabling, Category 6 cabling can be F/UTP, and Category 7 cabling can be S/FTP or F/FTP cabling.

The transmission rate on the twisted pair link is dependent on the channel conditions, which itself is dependent on the type of cabling, length of cabling, connectors, etc. Thus, in one embodiment, the 40 Gbit/s PHY, can be designed to support a set of standard and non-standard speeds between 10 Mbit/s and 40 Gbit/s. This particular supported set can be determined by beneficial (e.g., prevalent) cabling scenarios that cannot meet the stated requirement of 40 Gbit/s at up to 100 m. For example, it may be determined that supporting a particular operating mode that can work with 15 meters of Category 6A cabling having Category 7 or 7A connectors would be beneficial. As would be appreciated, the particular mapping between particular operating modes and channel conditions would be implementation dependent for a given PHY.

In another embodiment, the PHY is a 100 Gbit/s PHY or an intermediate rate PHY beyond 10 Gbit/s. Similar to the 40 Gbit/s example described above, the AN of the 100 Gbit/s or intermediate rate PHY can be designed to support and select from a plural set of operating modes that include standard or non-standard operating modes up to the supported rate beyond 10 Gbit/s. In general, the greater than 10 Gbit/s PHY can be designed to support variable rates above 10 Gbit/s and short reach modes under all speeds.

As noted, the greater than 10 Gbit/s PHY includes a PCS, a PMA, and PMD in addition to the AN. As illustrated in FIG. 1, the PCS is coupled to a reconciliation sublayer (RS), which provides a signal mapping between interface 110 and the MAC layer. The 40 Gbit/s PHY can be designed to operate with a MAC such as that defined by IEEE 802.3ba. In one embodiment, the greater than 10 Gbit/s PHY can be designed to operate with a simplified full-duplex MAC.

In the example of a 40 Gbit/s PHY, the PCS can be coupled to the RS via an XLGMII interface. In general, the XLGMII interface is a logical interconnection that supports 40 Gbit/s operation through its 64-bit wide transmit and receive data paths. The XLGMII interface is designed to connect a 40 Gbit/s MAC to a 40 Gbit/s PHY. In the example of a 100 Gbit/s PHY, the PCS can be coupled to the RS via a CGMII interface, which is a logical interconnection that supports 100 Gbit/s operation through its 64-bit wide transmit and receive data paths. The CGMII interface is designed to connect a 100 Gbit/s MAC to a 100 Gbit/s PHY.

The PCS is generally responsible for encoding/decoding to/from code-groups for communication with the underlying PMA. In one embodiment, the PCS can be designed for encoding/decoding 64-bit data to/from 66-bit code-groups (64B/66B) for communication with the underlying PMA. In various embodiments, one or more parts of the PHY can be internal or external to the MAC.

Figure 2:
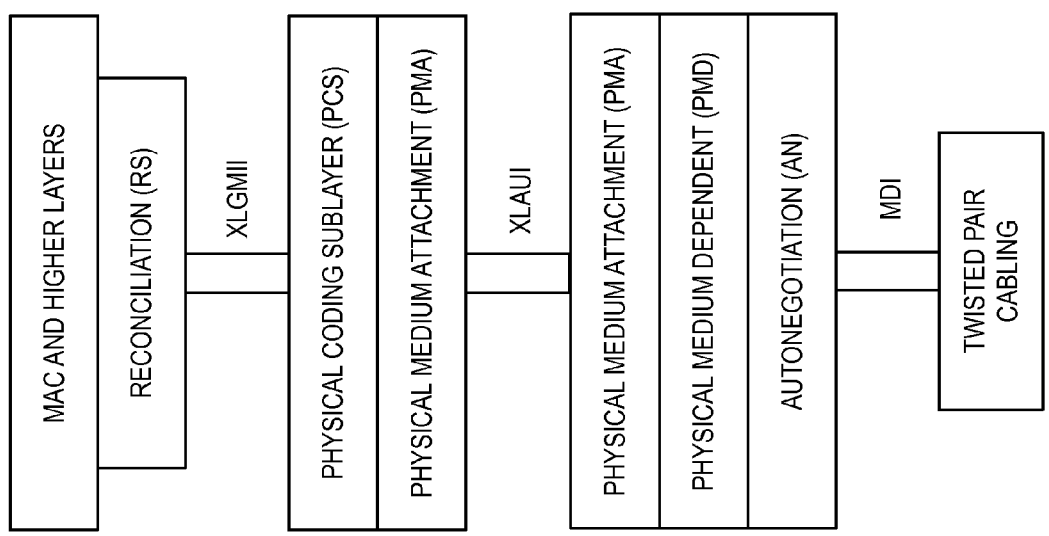
FIG. 2 illustrates an example of an extender interface.

In one embodiment, an extender such as the XLAUI (40 Gigabit Attachment Unit Interface) extender sublayer or CAUI (100 Gigabit Attachment Unit Interface) extender sublayer can be used between the MAC/PHY. FIG. 2 illustrates the use of XLAUI in a 40 Gbit/s PHY. As illustrated, XLAUI is a PMA service interface designed to extend the connection between 40 Gbit/s capable PMAs. A similar configuration can be used for CAUI in a 100 Gbit/s PHY, which would be designed to extend the connection between 100 Gbit/s capable PMAs.

Figure 3:
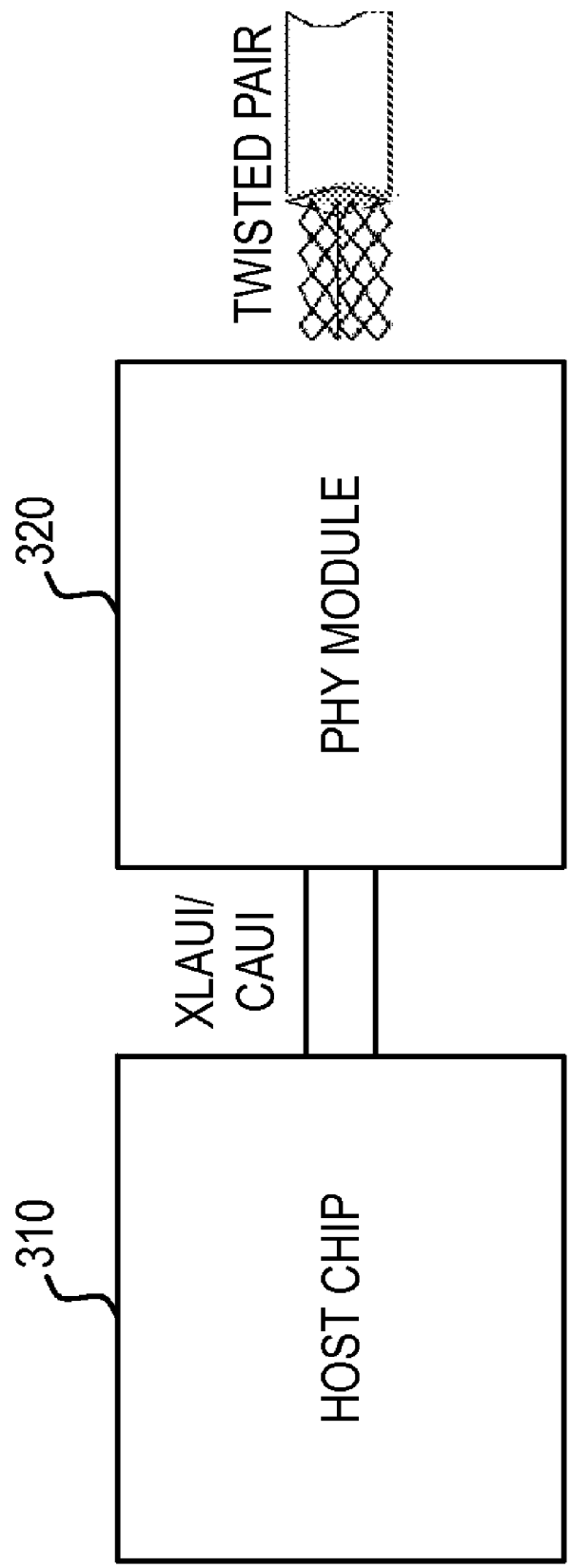
FIG. 3 illustrates an example of a chip-to-module interface.

A benefit of XLAUI/CAUI is its capability for use as a chip-to-chip or a chip-to-module interface. FIG. 3 illustrates an example of a chip-to-module interface between host chip 310 and PHY chip 320. Here, XLAUI/CAUI enables a modular design that allows gradual migration of PHY technology into an existing host system. In one embodiment, the greater than 10 Gbit/s PHY can be embodied as a pluggable PHY module and/or have the ability to drive Direct Attach Copper (DAC).

In general, the PMA abstracts the PCS from the physical medium. Accordingly, the PCS can be unaware of the type of medium. The primary functions of the PMA include mapping of transmit and receive code-groups between the PCS and PMA, serialization/de-serialization of code-groups for transmission/reception on the underlying PMD, recovery of clock from the coded data supplied by the PMD, and mapping of transmit and receive bits between the PMA and PMD.

Figure 4:
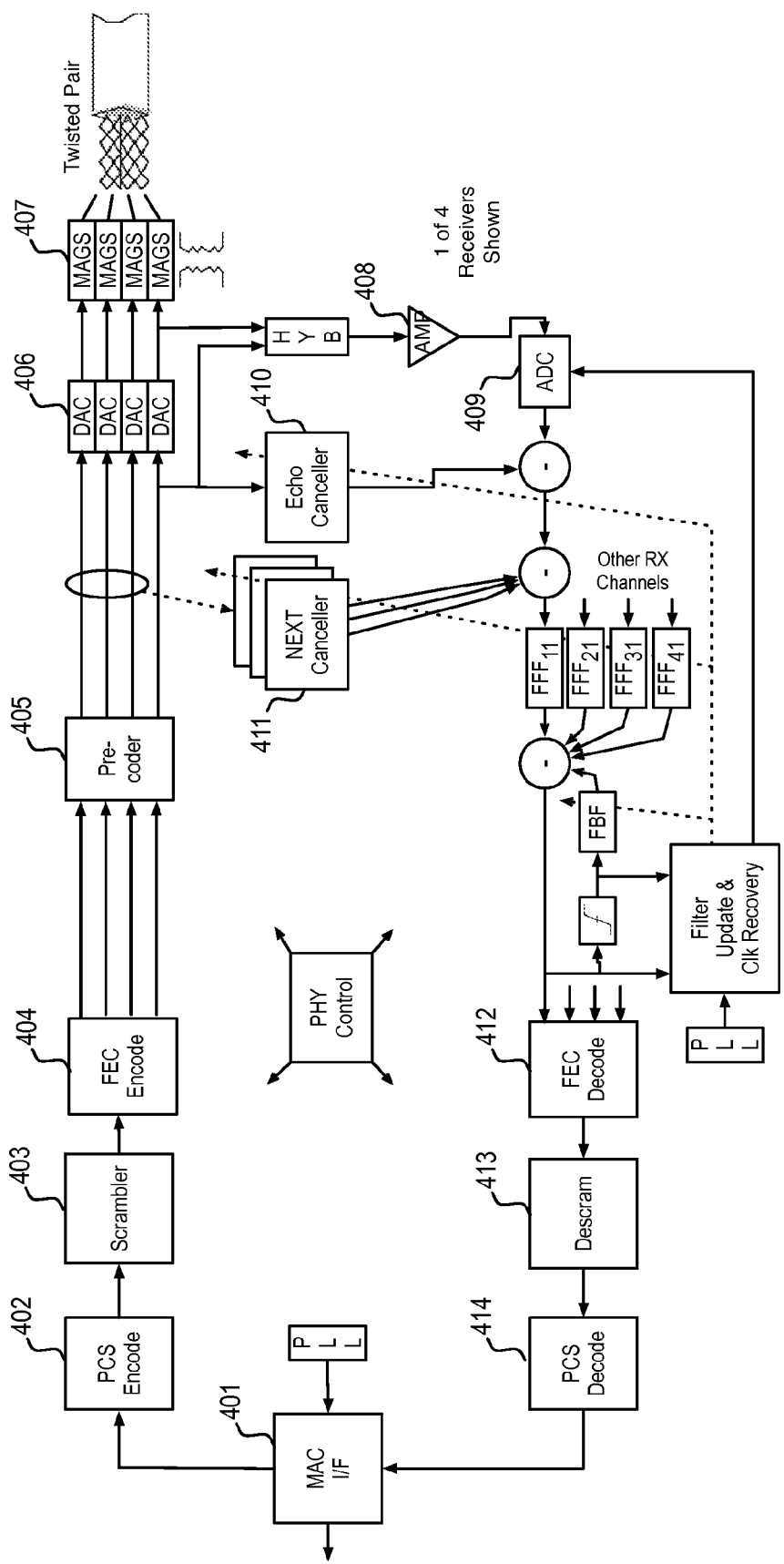
FIG. 4 illustrates an embodiment of an Ethernet physical layer device according to the present invention.

Having described the OSI reference model for the greater than 10 Gbit/s PHY, an example architecture is now described with reference to FIG. 4. As illustrated, the PHY transceiver includes a MAC I/F 401, which can be designed to support an XLGMII or CGMII interface. On the transmission side, the PHY transceiver can include PCS encode 402, Scrambler 403, FEC Encode 404, Pre-Coder 405, and Digital-Analog Converter (DAC) 406 functions. DACs 406 are coupled to magnetics (MAGs) 407 that can be designed to work with 10/100/1000/10G/>10G speeds as needed.

Correspondingly, on the receiver side, received signals are processed by Amplifier 408, Analog-Digital Converter (ADC) 409, Echo Canceller 410, Xtalk Canceller 411, FEC Decode 412, Descrambler 413, and PCS decode 414 functions, which deliver signals to MAC I/F 401.

As illustrated, the FEC Encode/Decode function can be instantiated for each PCS lane. In the example of FIG. 4, four lanes are shown. Thus, for a 40 Gbit/s PHY, each lane can carry 10 Gbit/s of data. As would be appreciated, the specific number of lanes used would be implementation dependent. For example, a 100 Gbit/s PHY could have 10 lanes that carry 10 Gbit/s of data, 20 lanes that carry 5 Gbit/s of data, 40 lanes that carry 2.5 Gbit/s of data, 100 lanes that carry 1 Gbit/s of data, etc.

In one embodiment, the FEC is embodied as a low density parity check (LDPC) code. As would be appreciated, the particular design of the FEC coding block would be implementation dependent and can be optimized in combination with the coding structure (e.g., PAM—pulse amplitude modulation). In one embodiment, enhanced LDPC is used, while in another embodiment no LDPC is used. In the latter case, the LDPC frame bits can be used for data transmission, thereby enhancing the data bandwidth.

In one embodiment, the 40 Gbit/s PHY uses a PAM-32 coding structure for 40 Gbit/s transmission, a PAM-16 coding structure for 10 Gbit/s transmission, etc. In one embodiment, the PHY control begins with a PAM-2 training sequence while in a training state. Upon detection of a different PAM signal (e.g., PAM-8, PAM-16, etc.), the PHY control would then transition to a host synchronization state, during which time the host would resolve to the particular operating mode that is agreed upon during autonegotiation. As noted above, this operating mode can be a variable rate. In general, the PHY control can be designed to get to a greater than 10 Gbit/s transmission rate by transitioning between different PAM signals (e.g., PAM-8, PAM-16, PAM-32, PAM-64, etc.).

It should be noted that the principles of the present invention can also be designed to work with other interfaces such as SLXGMII or SCGMII, which further serialize the XLGMII and CGMII interfaces, XFI-type interfaces, and/or with multiple interfaces grouped together.

Also, the principles of the present invention can be used in conjunction with energy efficient Ethernet networks and power over Ethernet networks. For example, in supporting energy efficient Ethernet networks, the greater than 10 Gbit/s PHY can be designed to reduce the link rate to a sub-rate of the main rate, thereby enabling a reduction in power. In one example, this sub-rate can be a zero rate, which produces maximum power savings.

One example of subrating is through the use of a subset PHY technique. In this subset PHY technique, a low link utilization period can be accommodated by transitioning the PHY to a lower link rate that is enabled by a subset of the parent PHY. In one embodiment, the subset PHY technique is enabled by turning off portions of the parent PHY to enable operation at a lower or subset rate. For example, a subset 10G PHY can be created from a parent 40G or 100G PHY by a process that turns off a subset of the channels. In another embodiment, the subset PHY technique is enabled by slowing down the clock rate of a parent PHY. For example, a parent PHY having an enhanced core that can be slowed down and sped up by a frequency multiple can be slowed down by a factor of 10 during low link utilization, then sped up by a factor of 10 when a burst of data is received. In this example of a factor of 10, a 100G enhanced core can be transitioned down to a 10G link rate when idle, and sped back up to a 100G link rate when data is to be transmitted.

Another example of subrating is through the use of a low power idle (LPI) technique. In general, LPI relies on turning the active channel silent when there is nothing to transmit. Energy is thereby saved when the link is off. Refresh signals can be sent periodically to enable wake up from the sleep mode.

In general, both the subset and LPI techniques involve turning off or otherwise modifying portions of the PHY during a period of low link utilization. As in the PHY, power savings in the higher layers (e.g., MAC or MAC/PHY interface) can also be achieved by using various forms of subrating as well.

In one embodiment, energy efficient PHYs can communicate control and status information with a MAC using control codes that can be tunneled through an existing interface (e.g., XLAUI, CAUI, XFI-type, xxMII or derivative interfaces) without generating errors. Since the control codes are out of the data path, the control codes would not affect the data and allow for quick action.

In one embodiment, sequence ||Q|| ordered sets can be used. In general, sequence ordered sets consist of a control character followed by three data characters. For example, the format /K28.4/Dx.y/Dx.y/Dx.y/ can be used, where the code group K28.4 has an octet value of 9C and D is any code group. Conventionally, sequence ordered sets have been used to communicate link status information such as the reporting of a local or remote fault. In the present invention, it is recognized that sequence ordered sets provide an advantageous tunneling mechanism to communicate EEE control and status information between a MAC and energy efficient PHY.

As described in the example above or through other implementations, the greater than 10 Gbit/s PHY can be designed to operate with legacy 40G/100G MACs.

In one embodiment, the greater than 10 Gbit/s PHY can be designed to include buffering on the PHY chip itself (or in the separate extender chip) to provide support for enhanced energy efficient Ethernet network operation. In one embodiment, the greater than 10 Gbit/s PHY can be integrated with a controller or a switch via multichip modules (MCMs).

In one embodiment, the greater than 10 Gbit/s PHY can also be designed to support time synchronization features, which enable the provision of reliable, high quality of service (QoS) and low-latency connections. In one application, these high QoS and low-latency connections can facilitate streaming media. One example of a connection reservation protocol is AV bridging technology, which can be applied to AV streaming across the network. In general, AV bridging such as that described in IEEE 802.1 has been developed to reserve a connection with a certain QoS. In this process, a bandwidth reservation protocol and a time synchronization protocol can be implemented to reserve a connection with guaranteed levels of bandwidth and latency. IEEE 802.1AS provides additional details of a time synchronization protocol.

These and other aspects of the present invention will become apparent to those skilled in the art by a review of the preceding detailed description. Although a number of salient features of the present invention have been described above, the invention is capable of other embodiments and of being practiced and carried out in various ways that would be apparent to one of ordinary skill in the art after reading the disclosed invention, therefore the above description should not be considered to be exclusive of these other embodiments. Also, it is to be understood that the phraseology and terminology employed herein are for the purposes of description and should not be regarded as limiting.

What is claimed is:

1. A physical layer device for the transmission of data over a twisted pair copper cable, comprising:
    a media access control layer interface that supports a first data transmission rate of 40 Gbit/s;
    a first forward error correction coder that supports the generation of forward error correction code blocks for transmission at said first data transmission rate over said twisted pair copper cable;
    a second forward error correction coder that supports the generation of forward error correction code blocks for transmission at a second data transmission rate of 10 Gbit/s over said twisted pair copper cable;
    a medium interface that supports transmission over said twisted pair copper cable; and
    an autonegotiation sub layer that is configured to facilitate a selection of a negotiated transmission rate from a set of transmission rates that includes said first data transmission rate, said second data transmission rate, and a third data transmission rate between said first data transmission rate and said second data transmission rate for a short reach mode of communication having a cable length limit that does not approach 100 meters, wherein said selection of said third data transmission rate is based on an analysis of discovered communication characteristics that enables identification of a type of twisted pair copper cable and a length of said twisted pair copper cable that is less than said cable length limit.

2. The physical layer device of claim 1, wherein said media access control layer interface is defined by IEEE 802.3ba.

3. The physical layer device of claim 1, wherein said forward error correction coder is a low density parity check coder.

4. The physical layer device of claim 1, wherein said second forward error correction coder is a 10GBASE-T forward error correction coder.

5. The physical layer device of claim 1, wherein said discovered communication characteristics are determined through testing of said twisted pair copper cable by said physical layer device.

6. The physical layer device of claim 1, wherein said selection of said negotiated transmission rate uses unformatted next page messages.

7. The physical layer device of claim 1, wherein said selection of said negotiated transmission rate uses physical signaling.

8. The physical layer device of claim 1, wherein said selection of said negotiated transmission rate uses Layer 2 messaging.

9. A variable-rate physical layer device for the transmission of data over a twisted pair copper cable, comprising:
  a media access control layer interface that supports a first data transmission rate of 40 Gbit/s;
  a first forward error correction coder that supports the generation of forward error correction code blocks for transmission at said first data transmission rate over said twisted pair copper cable;
  a second forward error correction coder that supports the generation of forward error correction code blocks for transmission at a second data transmission rate of 10 Gbit/s over said twisted pair copper cable;
  a medium interface that supports transmission over said twisted pair copper cable; and
  an autonegotiation sub layer that is configured to facilitate a selection of a negotiated transmission rate from a set of transmission rates that includes said first data transmission rate, said second data transmission rate, and a third data transmission rate between said first data transmission rate and said second data transmission rate, wherein said selection of said third data transmission rate is based on an analysis of discovered communication characteristics that enables identification of a type and/or length of twisted pair copper cable that is not suitable for transmission at said first data transmission rate.

10. The physical layer device of claim 9, wherein said media access control layer interface is defined by IEEE 802.3ba.

11. The physical layer device of claim 9, wherein said forward error correction coder is a low density parity check coder.

12. The physical layer device of claim 9, wherein said second forward error correction coder is a 10GBASE-T forward error correction coder.

13. The physical layer device of claim 9, wherein said selection of said negotiated transmission rate uses unformatted next page messages.

14. The physical layer device of claim 9, wherein said selection of said negotiated transmission rate uses physical signaling.

15. The physical layer device of claim 9, wherein said selection of said negotiated transmission rate uses Layer 2 messaging.

* * * * *